United States Patent
Shimizu et al.

(10) Patent No.: US 7,269,045 B2
(45) Date of Patent: Sep. 11, 2007

(54) MAGNETIC RANDOM ACCESS MEMORY WITH INTERCONNECTED WRITE LINES

(75) Inventors: Yuui Shimizu, Yokohama (JP);
Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/217,296

(22) Filed: Sep. 2, 2005

(65) Prior Publication Data

US 2006/0279982 A1   Dec. 14, 2006

(30) Foreign Application Priority Data

Jun. 8, 2005   (JP)   ............................. 2005-168305

(51) Int. Cl.
*G11C 5/06*   (2006.01)
(52) U.S. Cl. .................... 365/63; 365/158; 365/230.06
(58) Field of Classification Search .................. 365/63, 365/158, 230.06
See application file for complete search history.

(56) References Cited

U.S. PATENT DOCUMENTS 6,807,086 B2 * 10/2004 Kajiyama .................... 365/157
6,912,152 B2 *  6/2005 Iwata et al. ................. 365/158

FOREIGN PATENT DOCUMENTS

JP   2004-206788   7/2004

OTHER PUBLICATIONS

Roy Scheuerlein, et al., "A 10ns Read and Write Non-Volatile Memory Array Using a Magnetic Tunnel Junction and FET Switch in Each Cell", 2000 IEEE International Solid-State Circuits Conference, TA 7.2, pp. 128-129.
M. Durlam, et al., "Nonvolatile RAM Based on Magnetic Tunnel Junction Elements", 2000 IEEE International Solid-State Circuits Conference, TA 7.3, pp. 130-131.
M. Durlam, et al., "A 0.18μm 4Mb Toggling MRAM", 2003 IEEE.

* cited by examiner

*Primary Examiner*—Hoai V. Ho
(74) *Attorney, Agent, or Firm*—Oblon, Spivak, McClelland, Maier & Neustadt, P.C.

(57) ABSTRACT

A magnetic random access memory includes memory cells which store information using an internal magnetization direction. A first write line includes a first extending portion, a second extending portion and a first connection portion. The first extends portion extends along a first direction and has a first end and a second end. The second extending portion extends along the first direction and has a third end facing the first end and a fourth end facing the second end. The first connection portion connects the first end and the third end. A second write line and the first write line sandwiches one of the memory cells. First peripheral circuits are connected to the first connection portion and to at least one of the second end and the fourth end.

18 Claims, 9 Drawing Sheets

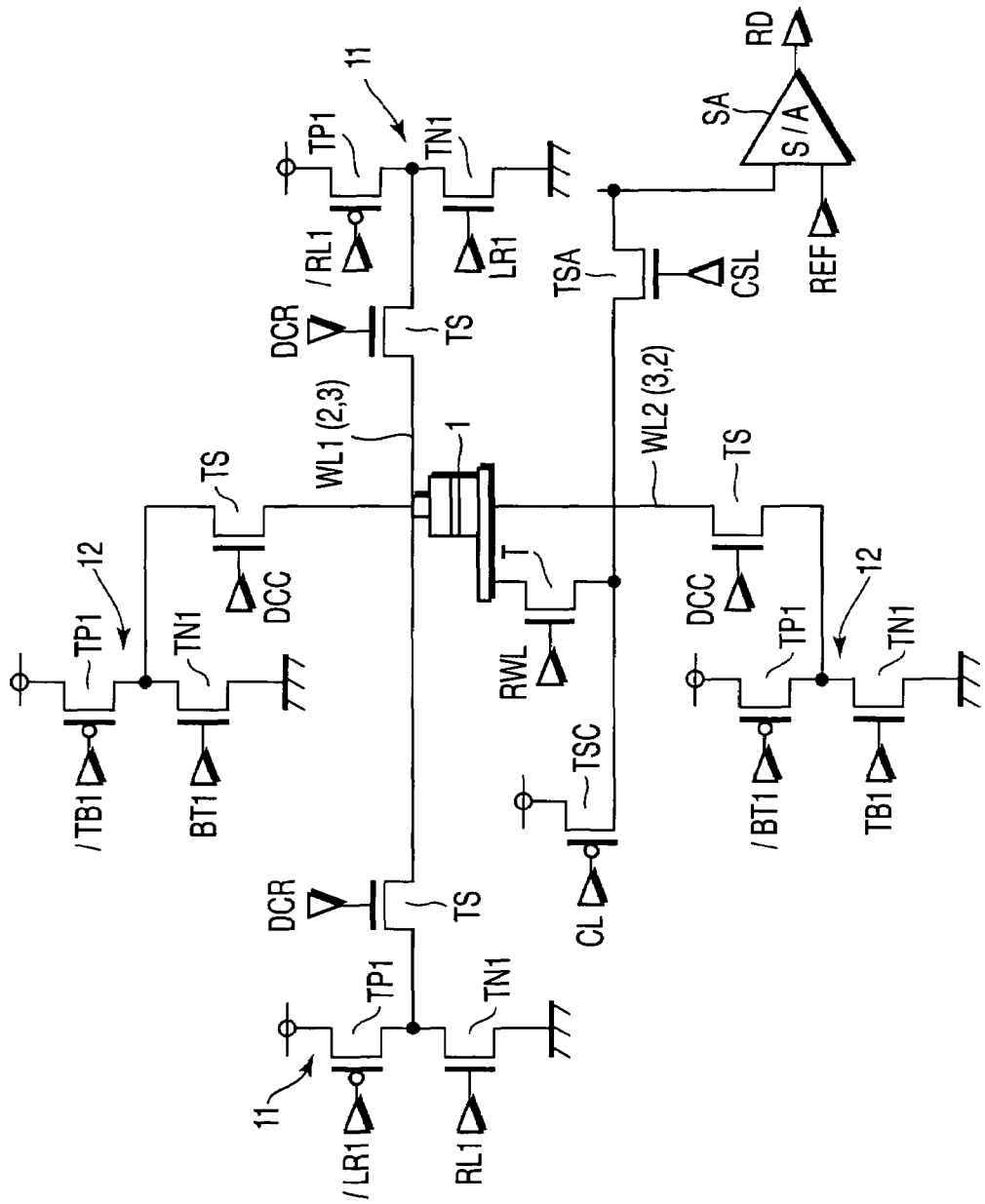
F I G. 12

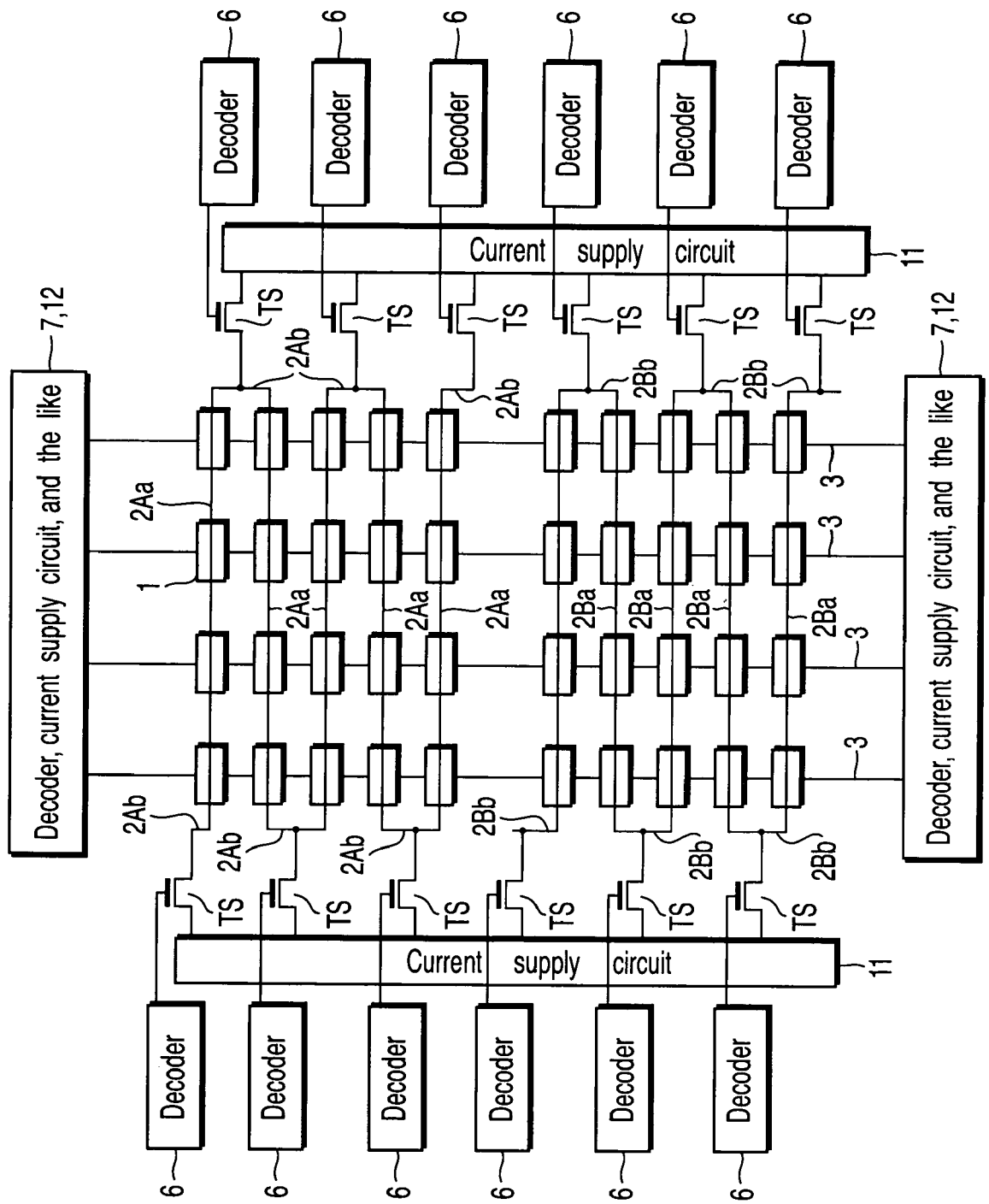
F I G. 16

MAGNETIC RANDOM ACCESS MEMORY WITH INTERCONNECTED WRITE LINES

CROSS-REFERENCE TO RELATED APPLICATIONS

This application is based upon and claims the benefit of priority from prior Japanese Patent Application No. 2005-168305, filed Jun. 8, 2005, the entire contents of which are incorporated herein by reference.

BACKGROUND OF THE INVENTION

1. Field of the Invention

The present invention relates to a magnetic random access memory, and for example, to the shape of write lines in the magnetic random access memory.

2. Description of the Related Art

One of the essentials for development of memories such as magnetic random access memories (MRAM) is an increase in their degree of integration.

Peripheral circuits such as current supply circuits, selectors, or decoders are connected to wires (write lines and the like) in a memory cell array in a magnetic random access memory. The degree of integration of memory cells has recently been increasing with the development of related technologies. However, the degree of integration of the peripheral circuits does not always increase as fast as the speed of the degree of integration of memory cells. Thus, when the pitch of the peripheral circuits is larger than the arrangement pitch of the memory cells, the pitch of the peripheral circuits limits the pitch of the memory cells.

To match the pitch of the peripheral circuits with that of the memory cells, it is possible to increase one of the lengths of the peripheral circuit (for example, the lateral length of a row decoder) to reduce the other length (for example, the vertical length of the row decoder). However, this technique may increase the area of the peripheral circuit depending on the arrangement of elements constituting the peripheral circuit.

If the decoder uses a 2- or 3-input NAND circuit, it is ideal to arrange n-type transistors constituting the NAND circuit in series in order to reduce the area of the decoder. However, transistors must be arranged in parallel utilizing metal wires or the like to change the planar shape of the decoder. This increases the area of the decoder beyond that required for the series arrangement.

Further, peripheral circuits such as selectors and write current supply circuits present a similar problem. That is, a large write current is presently required, leading to the need for the large gate width of transistors used in these peripheral circuits. To meet this requirement, a plurality of transistors connected in parallel functions as one transistor having a large gate width.

For peripheral circuits such as decoders or write current supply circuits, as many circuits as the rows or columns in the memory cell array are arranged one after another. Accordingly, a reduction of the peripheral circuit size is significant for reducing the entire chip size. Thus, the above technique is inconsistent with the above requirement and is not practical.

Jpn. Pat. Appln. KOKAI Publication No. 2004-206788 discloses that electrically coupling a global address selection line shared by several subarrays to a source region of an access transistor to reduce the number of metal wires.

BRIEF SUMMARY OF THE INVENTION

According to a first aspect of the present invention, there is provided a magnetic random access memory comprising: a plurality of memory cells which store information using an internal magnetization direction; a first write line including a first extending portion, a second extending portion and a first connection portion, the first extending portion extending along a first direction and having a first end and a second end, the second extending portion extending along the first direction and having a third end facing the first end and a fourth end facing the second end, the first connection portion connecting the first end and the third end; a second write line, the first write line and the second write line sandwiching one of the plurality of memory cells; and a plurality of first peripheral circuits connected to the first connection portion and to at least one of the second end and the fourth end.

According to a second aspect of the present invention, there is provided a magnetic random access memory comprising: a plurality of memory cells arranged in a matrix and storing information using an internal magnetization direction; a first write line comprising a plurality of first extending portions passing rows of the matrix and a plurality of first connection portions, the plurality of first extending portions having a first end at a same side and having a second end at a same side, the first end of one of the first extending portions connected to next one of the first end on one side, and the second end of the one of the first extending portion connected to next of the second end on the other side, a second write line, the first write line and the second write line sandwiching the plurality of memory cells; and a plurality of peripheral circuits each of which is provided for one of the plurality of first connection portions to flow a current through one of the plurality of first extending portions.

According to a third aspect of the present invention, there is provided a magnetic random access memory comprising: memory cells which store information using an internal magnetization direction; first write lines extending along a first direction and connected at ends as a line; second write lines extending along a second direction, the first write line and the second write line sandwiching the memory cell; peripheral circuits connected to the first write lines, wherein a number of peripheral circuits is less than a twice number of the first lines.

BRIEF DESCRIPTION OF THE SEVERAL VIEWS OF THE DRAWING

FIG. 12 is a circuit diagram showing a configuration including a reading system according to the second embodiment;

FIG. 16 is a plan view schematically showing a main part of a magnetic random access memory according to a variation of the fourth embodiment of the present invention.

DETAILED DESCRIPTION OF THE INVENTION

Figure 1:
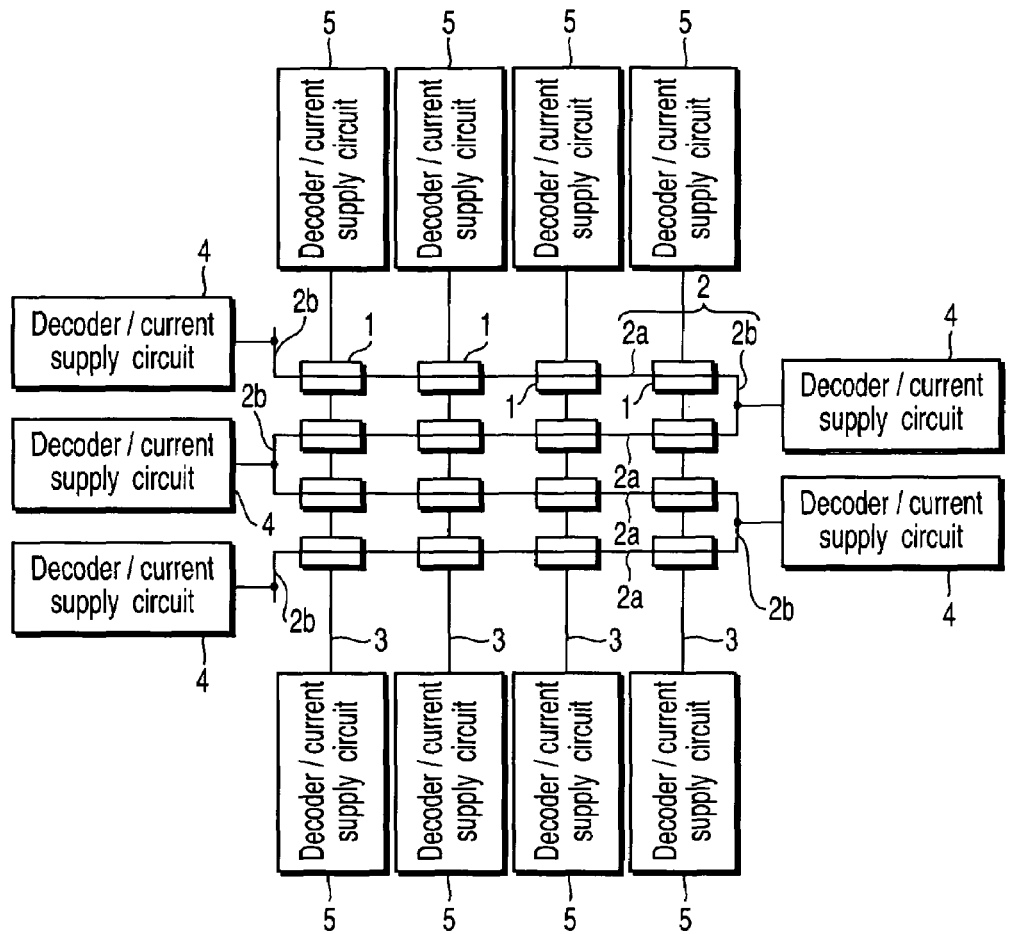
FIG. 1 is a plan view schematically showing a main part of a magnetic random access memory according to a first embodiment of the present invention.

Embodiments of the present invention will be described with reference to the drawings. In the description below, components having substantially the same functions and configurations have the same reference numerals. Duplicate descriptions will be given only when required.

First Embodiment

FIG. 1 is a plan view schematically showing a main part of a magnetic random access memory according to a first embodiment of the present invention. As shown in FIG. 1, memory cells 1 are arranged in a matrix. The memory cell 1 is composed of, for example, an MTJ (Magnetic Tunnel Junction) element. The MTJ element will be described later.

The magnetic random access memory is provided with two kinds of write lines. As described later, write lines of one of the two kinds are electrically connected to the memory cells, while write lines of the other one of the two kinds are insulated. Write lines of one of the two kinds pass over the memory cells, while write lines of the other of the two kinds pass under the memory cells. Write lines of one of the two kinds extend across the rows, while write lines of the other one of the two kinds extend across the columns. These combinations do not limit the present embodiment and the embodiments described below. Accordingly, an example of the possible combinations will be described below.

Write line 2 passes under or over the memory cells 1; in the following description, the write line 2 passes over the memory cells 1. Write lines 3 pass under or over the memory cells 1, the write line 3 passes under the memory cells 1.

The write line 2 consists of extending portions 2a and connection portions 2b. The extending portions 2a pass over the memory cells 1 belonging to the same row.

The connection portion 2b connects the extending portion 2a of the n-th row at one end to the same end (right-hand end) of the extending portion 2a of the n−1-th row as that of the extending portion 2a of the n-th row. The connection portion 2b connects the extending portion 2a of the n-th row at the other end to the same end (left-hand end) of the extending portion 2a of the n+1-th row as that of the extending portion 2a of the n-th row. According to this law, vertically adjacent extending portions 2a are connected together. All the extending portions 2a are thus connected together to form the continuous write line 2.

Write lines 3 are independent of one another and each passes under the memory cells 1 belonging to the same column.

Each connection portion 2a is connected to a decoder/current supply circuit (peripheral circuit) 4. Thus, one decoder/current supply circuit 4 is provided for two connection portions 2a (for two rows). The decoder/current supply circuits 4 are arranged in parallel in the same direction (the vertical direction of the drawing) as that in which the rows of the memory cells 1 are arranged in parallel.

The decoder/current supply circuit 4 is supplied with an external address signal, power supply potential, and ground potential (common potential). The decoder/current supply circuit 4 specified by the address signal is activated to supply a write current to a predetermined position on the write line 2.

Each of the connection portions of the write line 3 is connected to a decoder/current supply circuit 5. The decoder/current supply circuit 5 has the same configuration as that of, for example, the decoder/current supply circuit 4.

Figure 2:
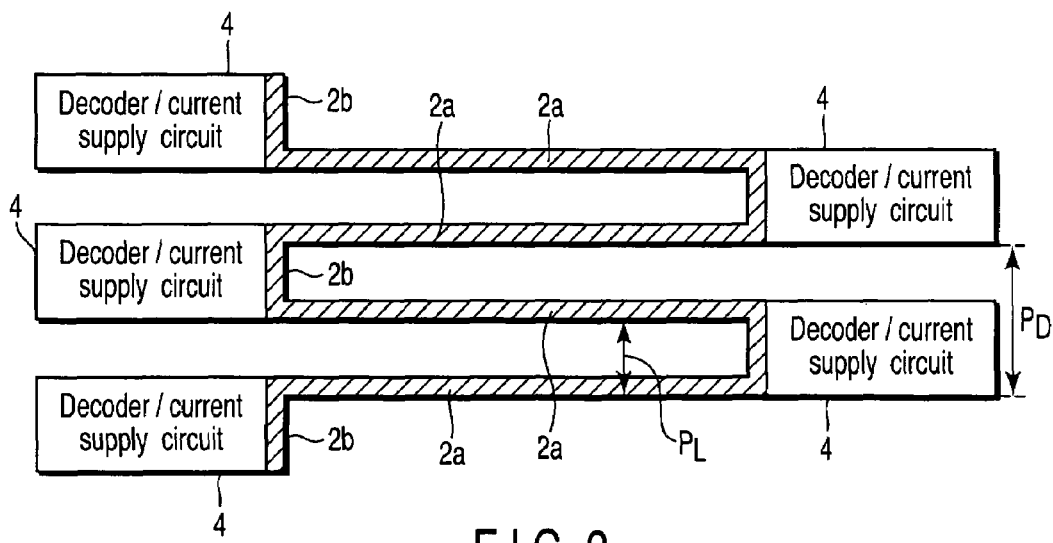
FIG. 2 is a diagram showing the layout of a main part of the magnetic random access memory according to the first embodiment.

FIG. 2 is a diagram showing the layout of a main part of the magnetic random access memory according to the first embodiment. As shown in FIG. 2, the pitch of the extending portions 2a is PL. The pitch of the decoder/current supply circuits is PD. As described above, one decoder/current supply circuit 4 is provided for two extending portions 2a, therefore the pitch PD is larger than the pitch PL.

In contrast, if one decoder/current supply circuit 4 is provided for each write line (corresponding to each extending portion 2a in the present embodiment), the pitch of the decoder/current supply circuits is at least the same as or larger than that of the write lines. This is because the decoder/current supply circuits have a higher degree of integration than that of the memory cells, and thus the reduction ratio of the pitch of the decoder/current supply circuits does not catch up with that of the pitch of the memory cells.

Figure 3:
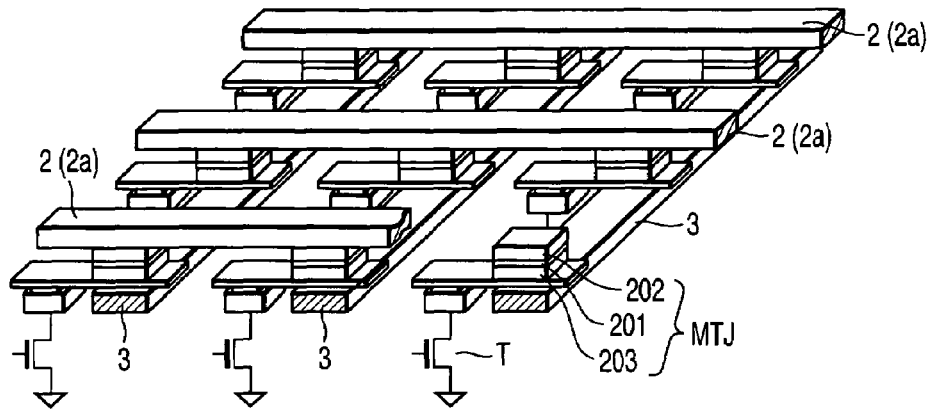
FIG. 3 is a perspective view showing the configuration of an example of MTJ elements that can be employed for the first embodiment as well as the configuration of its surroundings.

Now, the MTJ element will be described. The MTJ element may have any structure provided that it can store at least binary information according to a magnetic field applied to the MTJ element. FIG. 3 is a perspective view showing the configuration of an example of MTJ elements that can be employed for the first embodiment as well as the configuration of its surroundings. As shown in FIG. 3, a plurality of MTJ elements MTJ are provided in a matrix.

Typically, the MTJ element MTJ is composed of one insulating film 201 and two ferromagnetic films 202 and 203 sandwiching the insulating film 201. One of the ferromagnetic layers has its magnetization direction (the direction of spins) fixed by an antiferromagnetic layer (not shown) provided adjacent to it. This ferromagnetic layer is called, for example, a pinned layer, a fixed layer, or a reference layer.

The other ferromagnetic film has a magnetization direction configured to be invertible along the easy axis of magnetization. This ferromagnetic film is called, for example, a free layer or a storage layer. Binary data is recorded depending on whether the directions of the magnetization in the free layer and pinned layer are antiparallel or parallel.

One end (the upper end in the figure) of each of the MTJ elements MTJ belonging to the same row is connected to the write line 2 (the extending portion 2a of the write line). The other end (the lower end in the figure) of each MTJ element is connected to a ground potential end via a selection transistor T.

The write line 3 passes under the other end of each of the MTJ elements MTJ belonging to the same column.

Information is written to the MTJ element by flowing a current through the write lines 2 and 3. Magnetic fields are generated by this current around the write lines 2 and 3, and their synthetic field is applied to the MTJ element MTJ. The synthetic field inverts the direction of magnetization in the free layer to allow information to be written.

Figure 4:
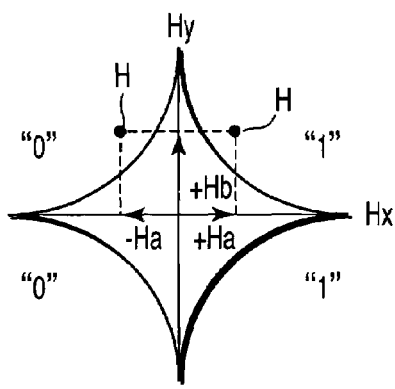
FIG. 4 is a diagram showing the write characteristic of the MTJ element.

Information to be written determines the direction of a current flowing through one or both of the write lines 2 and 3. More specifically, the determination is made as described below. FIG. 4 shows the write characteristic of the MTJ element.

Typically, the write lines 2 and 3 are orthogonal to each other. The magnetization direction in the free layer is inverted if a synthetic field H applied to the MTJ element MTJ is located outside an asteroid curve on a plane consisting of axes corresponding to the magnitudes of magnetic fields from the write lines 2 and 3. In the example shown in FIG. 4, for the write line used to apply a magnetic field in the direction of a magnetic field Hx, the current must flow in two directions. For the direction of a magnetic field Hy, it is sufficient for the current to flow in one direction.

Now, an example of the decoder/current supply circuit 4 will be described with reference to FIG. 5. This figure is a diagram showing a configuration applied to the decoder/current supply circuit 4 according to the first embodiment. The decoder/current supply circuit 4 is configured to selectively pass a current in two directions of the connected write line 2.

Figure 5:
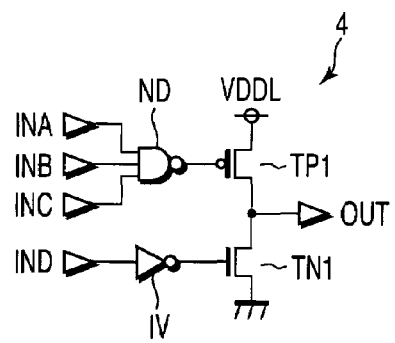
FIG. 5 is a diagram showing a configuration applicable to a decoder/current supply circuit according to the first embodiment.

As shown in FIG. 5, one decoder/current supply circuit 4 is typically composed of a NAND circuit ND, an inverter IV, a p-type metal oxide semiconductor field effect transistor (MOSFET) TP1, and an n-type MOSFET TN1.

The transistors TP1 and TN1 connected in series are provided between a potential supply end VDDL and a ground potential end to function as a current supply circuit. An output OUT of the decoder/current supply circuit 4 is obtained from the connection node between the transistors TP1 and TN1. The NAND circuit ND and the inverter IV function as a decoder.

The power supply potential supply end VDDL and the transistor TP1 function as a current driver that supplies a current into the memory cell. The ground potential end and the transistor TN1 function as a current sinker that leads out a current.

The NAND circuit ND has, for example, three input ends INA, INB, and INC. A gate of the transistor TP1 is controlled by an output from the NAND circuit ND. The gate of the transistor TN1 is controlled by an output from the inverter IV. External address signals are supplied to the input ends INA, INB, and INC and the input end IND of the inverter IV.

As described with reference to FIG. 4, data can be written to the memory cell 1 by supplying the write current to one of the write lines 2 and 3 in one direction. Thus, it is sufficient that only a current driver or sinker and the corresponding decoder are possessed by the decoder/current supply circuit 4 connected to the write line through which a current flows in only one direction.

Figure 6:
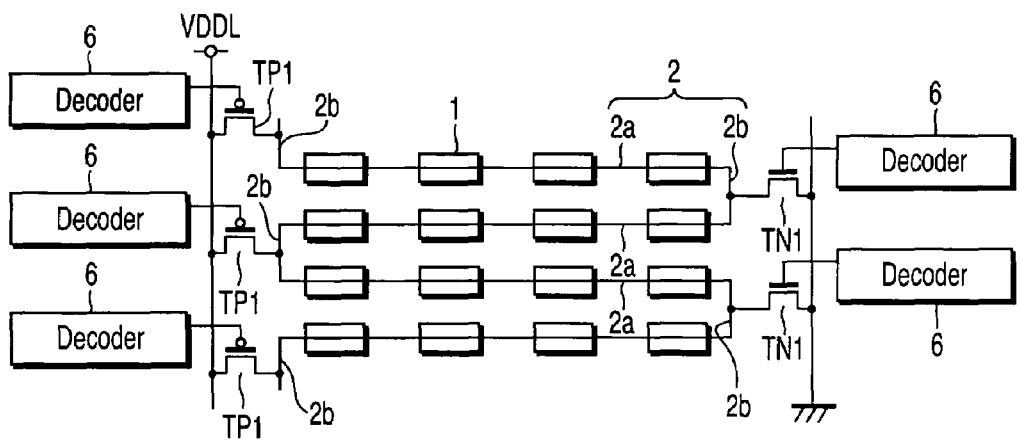
FIG. 6 is a diagram showing a write line through which a current flows in only one direction and its related parts.

FIG. 6 is a diagram showing a write line through which a current flows in only one direction and its related parts. FIG. 6 shows an example in which a current flows from the left-hand side to right-hand side of the figure. In FIG. 6, the write lines 3 and the relevant decoders and current supply circuits are omitted for simplification.

As shown in FIG. 6, the connection portion 2b connected to the left-hand end of each extending portion 2a is connected to the potential supply end VDDL via the transistor TP1. A decoder 6 is connected to the gate of the transistor TP1.

The connection portion 2b connected to the right-hand end of each extending portion 2a is connected to the ground potential end via the transistor TN1. A decoder 6 is connected to the gate of the transistor TN1. The decoder 6 turns on the transistor TP1 or TN1 depending on an external address signal.

For example, if the write current flows through the write line 2 in two directions and through the write line 3 in one direction, the decoder/current supply circuit 4 has the configuration shown in FIG. 5 and the decoder/current supply circuit for the write line 2 has the configuration shown in FIG. 6.

Figure 7:
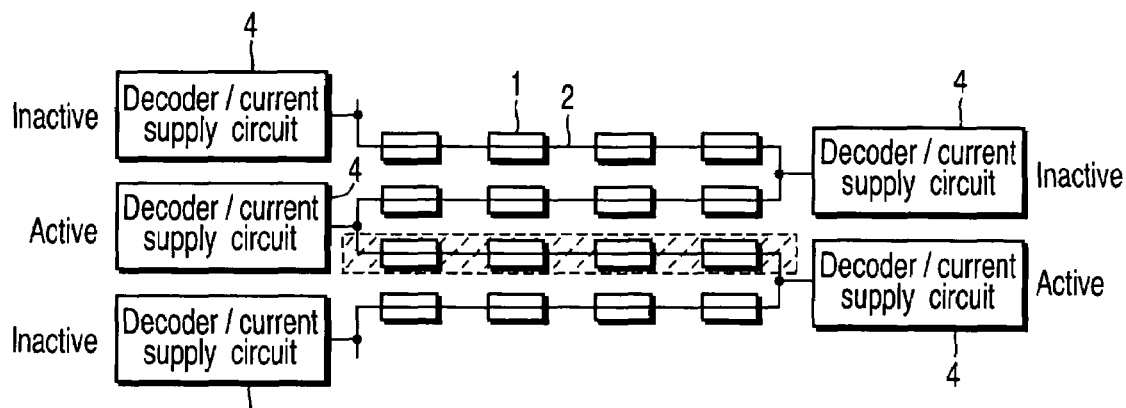
FIG. 7 is a diagram illustrating one of the states observed during a write operation according to the first embodiment.

Now, a method for writing will be described with reference to FIG. 7. FIG. 7 is a diagram illustrating one of the states observed during a write operation in the magnetic random access memory according to the first embodiment. FIG. 7 shows that data is written to the memory cells 1 in the third row (hatched in the figure) from the top of the figure. In FIG. 6, the write lines 3 and the relevant decoders and current supply circuits are omitted for simplification.

As shown in FIG. 7, the two decoder/current supply circuits 4 (referred to as the selected current supply circuits below) are activated which are connected to the extending portions 2a in the third row (referred to as the selected extending portions below). That is, the supply of an appropriate address signal turns on the transistor TP1 of one of an activated pair of the decoder/current supply circuits 4 in accordance with the direction in which the write current flows. The transistor TN1 of the other decoder/current supply circuit 4 is also turned on.

On the other hand, the other decoder/current supply circuits 4 remain inactive. As a result, the write current flows only through the selected extending portions 2a to set the memory cells 1 in the third row in a half-selected state.

Moreover, when the write current is supplied to the write line 3 (not shown) passing a write target memory cell 1, the memory cell 1 is selected and data is written to it.

Also in FIG. 6, the paired transistors TP1 and TN1 are turned on which are connected to the opposite ends of the selected extending portions 2a. As a result, the memory cells 1 which the selected extending portions 2a passes are set in the half-selected state.

The first embodiment describes the example in which the write line extending across the rows is composed of the plurality of extending portions and the connection portion. However, the present embodiment is applicable to write lines extending across the columns. This also applies to the embodiments described below.

In the magnetic random access memory according to the first embodiment, the plurality of adjacent extending portions 2a are connected together by the connection portion 2b. That is, one write line 2 passes through a plurality of rows (columns). Then, the decoder/current supply circuit 4 is provided for each connection portion 2b. As a result, one decoder/current supply circuit 4 is provided for every two rows. Thus, the pitch PD of the decoder/current supply circuits 4 is larger than that in the case where the decoder/current supply circuit 4 is provided for each row. This allows the pitch of the decoder/current supply circuits 4 to be sufficiently reduced consistently with the pitch of the extending portions 2a. This eliminates the limitation imposed on the pitch of the extending portions by the pitch of the decoder/current supply circuits 4.

Further, the first embodiment eliminates the need to change the layout of the decoder/current supply circuits 4 in an attempt to match the pitch of the decoder/current supply circuits 4 with the pitch of the extending portions 2a. This minimizes the area of the decoder/current supply circuit 4.

In this manner, it is possible to reduce the pitch of the extending portions 2a, while minimizing the area of the decoder/current supply circuit 4. Therefore, the area of the magnetic random access memory can be reduced.

Second Embodiment

According to a second embodiment, some extending portions share the current supply circuit.

Figure 8:
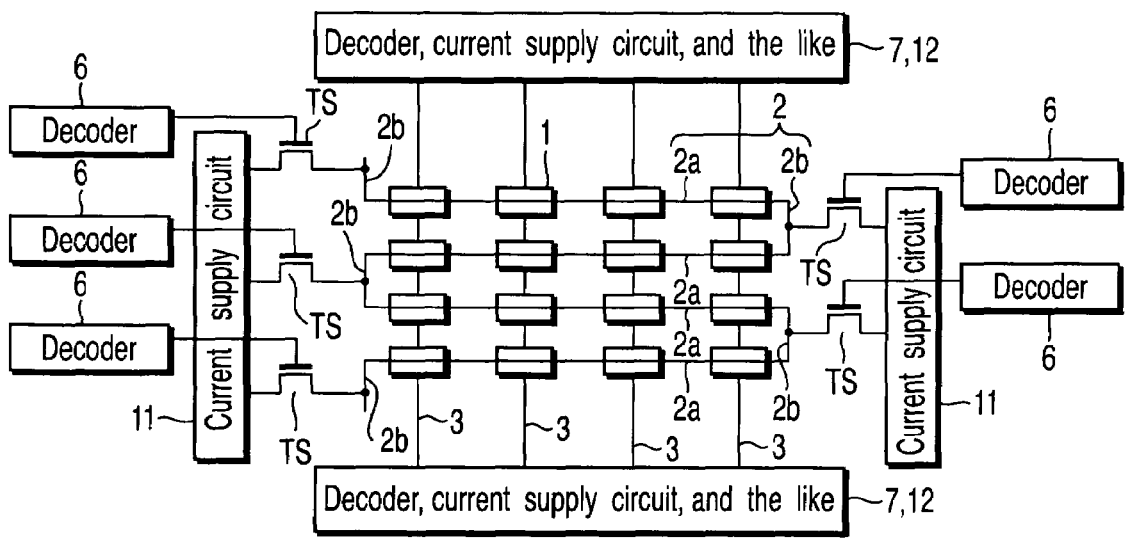
FIG. 8 is a plan view schematically showing a main part of a magnetic random access memory according to a second embodiment of the present invention.

FIG. 8 is a plan view schematically showing a main part of a magnetic random access memory according to the second embodiment of the present invention. As shown in FIG. 8, each connection portion 2b is connected to a current supply circuit 11 via a select transistor TS.

The decoder 6 controls a gate of each select transistor TS. Hence, one decoder 6 is provided for two extending portions 2a (for two rows). The decoders 6 are arranged in parallel along the same direction in which the rows of the memory cells 1 lie (the vertical direction of the drawing).

The decoder 6 is supplied with an address signal and supplies a control signal to turn on the select transistors TS connected to the opposite ends of the extending portions 2b in a row specified by the address. The decoder 6 may be composed of an address signal NAND element having an appropriate number of input ends as in the case of, for example, FIG. 5.

The write lines 3 may be similar to those according to the first embodiment or may have a configuration similar to that for the write lines 2 according to the second embodiment. That is, the decoder/current supply circuit 5 may be provided for each column as in the case of the first embodiment. Alternatively, some columns may share the current supply circuit 12 and the select transistor and the decoder 7 may control the connection between each column and a current supply circuit 12.

Figure 9:
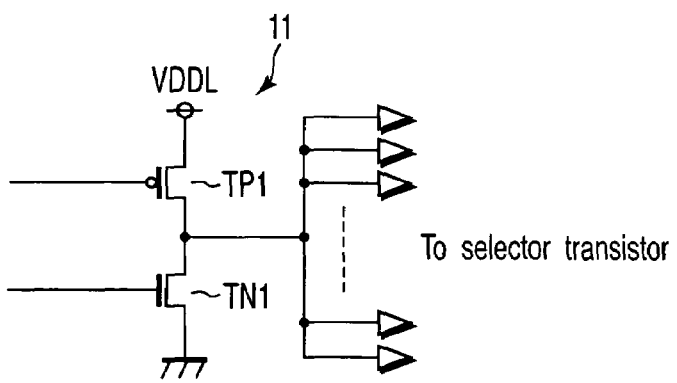
FIG. 9 is a diagram illustrating a configuration applicable to a current supply circuit according to the second embodiment.

FIG. 9 is a diagram illustrating a configuration applicable to the second embodiment. As shown in this figure, the current supply circuit 11 has the transistors TP1 and TN1 connected in series between the power supply end VDDL and the ground potential end.

To supply the write current, the transistor TP1 in one of an activated pair of the current supply circuits 11 and the transistor TN1 in the other current supply circuit 11 are turned on in accordance with the direction in which the write current should flow.

Figure 10:
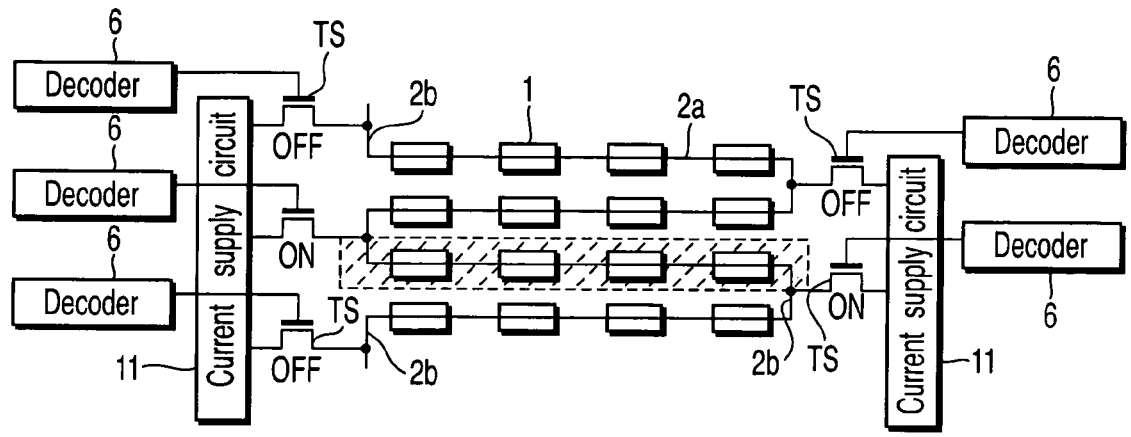
FIG. 10 is a diagram illustrating one of the states observed during a write operation according to the second embodiment.

Now, a method for writing will be described with reference to FIG. 10. This figure illustrates one of the states observed during a write operation in the magnetic random access memory according to the second embodiment. FIG. 10 shows that data is written to the memory cells 1 in the third row (hatched in the figure) from the top of the figure.

In FIG. 10, the write lines 3, decoders 7, and current supply circuits 12 are omitted for simplification.

The transistor TP1 in one of the current supply circuits 11 and the transistor TN1 in the other current supply circuit 11 are turned on in accordance with the direction of the write current. Then, the decoders 6 are supplied with an address signal specifying the selected extending portions 2a, to turn on the pair of select transistors TS located at the opposite ends of the selected extending portions 2a.

On the other hand, the other select transistors TS remain off. As a result, the write current flows only through the selected extending portions 2a to set the memory cells 1 in the third row in a half-selected state.

Moreover, when the write current is supplied to the write line 3 (not shown) passing a write target memory cell 1, the memory cell 1 is selected and data is written to it.

Now, a method for reading will be described with reference to FIGS. 11 and 12. As described above, in the magnetic random access memory, in general, one of the two write lines is electrically connected to the memory cells, while the other is electrically unconnected. A read operation is preformed using the potential (current) on the write line connected to the memory cells. Thus, the configuration of a reading circuit according to the present embodiment is selected as described below depending on whether or not the write line connected to the memory cells is the write line 2 according to the present embodiment (whether or not one write line passes some rows (columns)).

Figure 11:
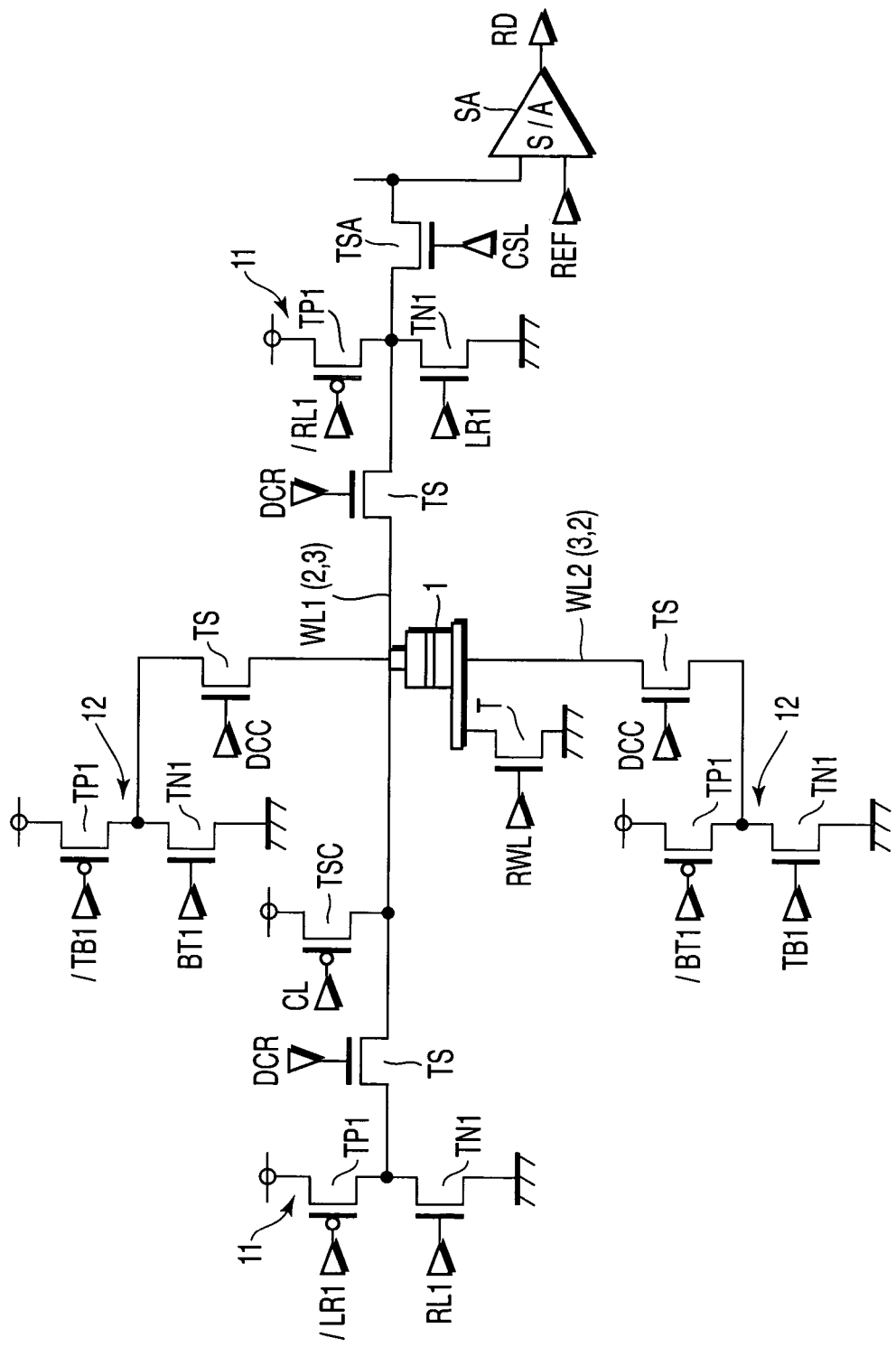
FIG. 11 is a circuit diagram showing a configuration including a reading system according to the second embodiment.

FIG. 11 is a circuit diagram showing a configuration including a reading system according to the second embodiment. In FIG. 11, a write line not connected to the memory cells 1 passes some rows (columns). That is, in FIG. 11, a write line WL1 extending in the lateral direction of FIG. 11 corresponds to the write line 3 in FIG. 8. A write line WL2 extending in the vertical direction of FIG. 11 corresponds to the write line 2 (extending portions 2a) in FIG. 8.

First, a writing circuit according to the present embodiment will be described. As shown in FIG. 11, each of the ends of the write lines WL1 and WL2 are connected to the connection node between the transistors TP1 and TN1 via the select transistor TS. The transistors TP1 and TN1 constitute the current supply circuits 11 and 12 and are connected between the power supply end VDDL and the ground potential end.

Complementary control signals /LR1 (/indicates negative logic) and LR1 are supplied to the gate of the transistor TP1 in one (left-hand side) of the paired current supply circuits 11 connected to the write line WL1 and to the gate of the transistor TN1 in the other (right-hand side) current supply circuit 11, respectively.

Similarly, complementary control signals RL1 and /RL1 are supplied to the gate of the transistor TN1 in one (left-hand side) of the paired current supply circuits 11 connected to the write line WL1 and to the gate of the transistor TP1 in the other (right-hand side) current supply circuit 11, respectively.

Complementary control signals /TB1 and TB1 are supplied to the gate of the transistor TP1 in one (upper side) of the paired current supply circuits 11 connected to the write line WL2 and to the gate of the transistor TN1 in the other (lower side) current supply circuit 11, respectively.

Similarly, complementary control signals BT1 and /BT1 are supplied to the gate of the transistor TN1 in one (upper side) of the paired current supply circuits 11 connected to the write line WL2 and to the gate of the transistor TP1 in the other (lower side) current supply circuit 11, respectively.

The decoder (for example, the decoder 6 in FIG. 8) supplies the control signals LR1, /LR1, RL1, /RL1, TB1, /TB1, BT1, and /BT1.

Now, the reading circuit will be described. The write line WL1 is connected to, for example, one end of the memory cell 1. The other end of the memory cell 1 is grounded via the selected transistor T. A gate of the selected transistor T is supplied by a reading decoder with a control signal specified by the address of a read target.

The write line WL1 is connected to a read potential supply end via a p-type transistor TSC. A gate of the transistor TSC is supplied with a signal CL set the low level during a read operation.

The write line WL1 is connected to one of the input ends of a sense amplifier SA via a p-type transistor TSA. A gate of the selected transistor TSA is supplied with a signal CSL set the high level during a read operation.

A reference potential REF is supplied to the other input end of the sense amplifier SA. The sense amplifier SA outputs a read signal RD.

For a read operation, the transistor TSC is turned on to supply a current to the write line WL2, or the potential of the write line WL2 rises. Then, the selection transistor T connected to a read target memory cell 1 is turned on. This forms a current path passing through the memory cell 1. The current (potential) of the write line WL1 increases by an amount which corresponds to the magnetization direction in the free layer of the memory cell 1. The degree of this change is detected using the sense amplifier SA and reference voltage REF, to generate a read signal RD.

On the other hand, if the write line connected to the memory cell 1 passes some rows (columns), the reading circuit shown in FIG. 11 cannot read a read signal. In this case, the configuration in FIG. 12 is required.

FIG. 12 is a circuit diagram showing a configuration including a reading system according to the second embodiment. In FIG. 12, the write line connected to the memory cell 1 is composed of the extending portion 2a and connection portion 2b. That is, the write line WL1 extending in the lateral direction of FIG. 12 corresponds to the write line 2 (extending portion 2a) shown in FIG. 8. The write line WL2 extending in the vertical direction of FIG. 12 corresponds to the write line 3 shown in FIG. 8.

The writing circuit is the same as that shown in FIG. 11. On the other hand, the reading circuit is composed as follows. As shown in FIG. 12, the transistor TSC is connected between the read potential supply end and one end of the selection transistor T. The other end of the transistor T is connected to one of the input ends of the sense amplifier SA via the transistor TSA. The other arrangements are similar to those shown in FIG. 11.

For a read operation, the transistor TSC is turned on. Then, the set of the transistors TS and TN1 connected to one end or the other end of the write line WL1 is tuned on. Further, the selection transistor T of the read target memory cell 1 is turned on. The current (potential) of the write line WL1 increases by an amount which corresponds to the magnetization direction in the free layer of the memory cell 1. The degree of this change is then read. In this manner, in FIG. 12, a read operation is performed using the write line WL1 as a ground potential line.

In the magnetic random access memory according to the second embodiment, one write line passes some rows (columns), with the decoder 6 provided for each connection portion 2b, as in the case of the first embodiment. The second embodiment thus produces effects similar to those of the first embodiment.

Furthermore, in the second embodiment, the current supply circuit 11 is shared by some rows (columns). This makes it possible to reduce the area of the entire current supply circuit 11.

Third Embodiment

The third embodiment not only has the configuration of the second embodiment but also includes the single write line 3 shaped to pass some columns.

Figure 13:
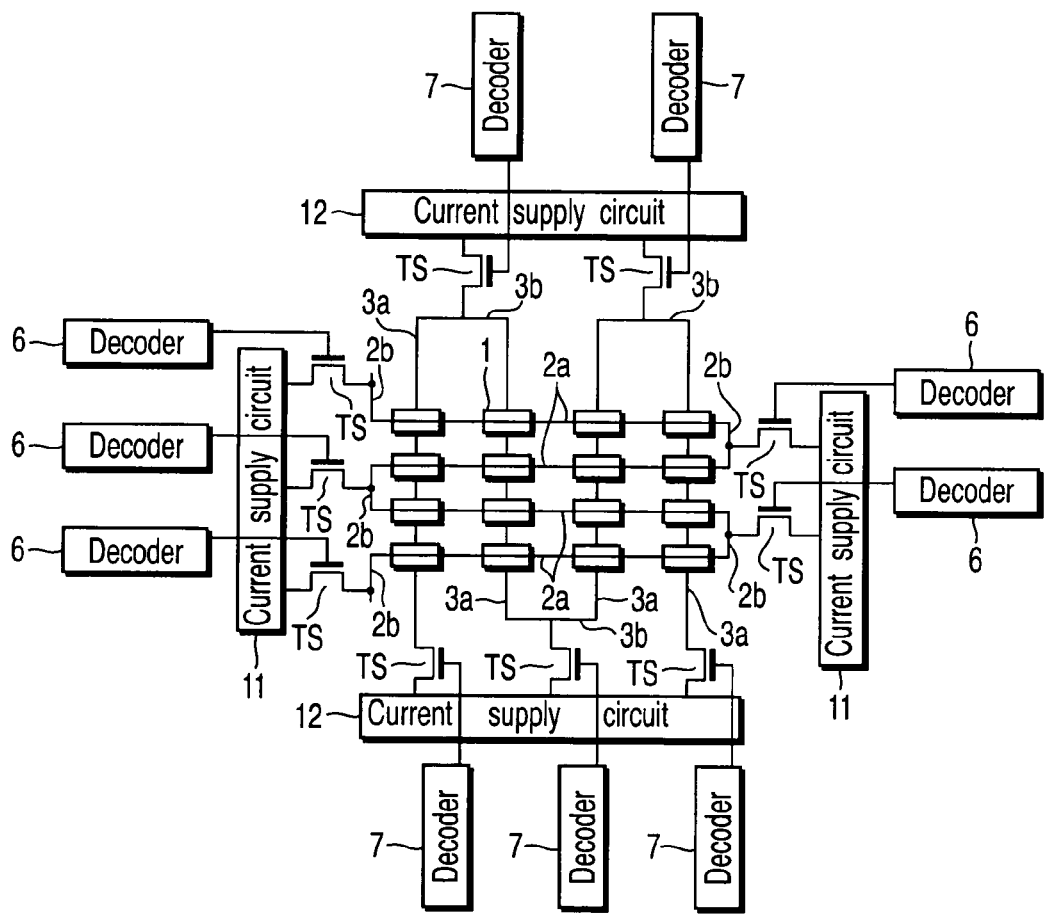
FIG. 13 is a plan view schematically showing a main part of a magnetic random access memory according to a third embodiment of the present invention.

FIG. 13 is a plan view schematically showing a main part of a magnetic random access memory according to a third embodiment of the present invention. As shown in FIG. 13, not only this embodiment has the configuration shown in FIG. 8 but also the write line 3 has a configuration similar to that of the write line 2. That is, the write line 3 consists of an extending portion 3a and a connection portion 3b. The extending portion 3a passes under the memory cells 1 belonging to the same column.

The connection portion 3b connects the extending portion 3a in the n-th column at one end (for example, the upper end) to the same end (upper end) of the extending portion 3a in the n−1-th column as that of the extending portion 3a in the n-th column. Further, the connection portion 3b connects the extending portion 3a in the n-th column at the other end (for example, the lower end) to the same end (lower end) of the extending portion 3a in the n+1-th column as that of the extending portion 3a in the n-th column. According to this law, laterally adjacent extending portions 3a are connected together. All the extending portions 3a are thus connected together to form the continuous write line 3.

The current supply circuit and decoder for the write line 3 are the same as those for the write line 2. That is, the connection portions 3a are connected to the current supply circuit 12 via the select transistor TS.

The decoder 7 controls the gate of each of the select transistors TS. Hence, one decoder 7 is provided for two extending portions 3a (for two columns). The decoders 7 are arranged in parallel along the same direction in which the columns of the memory cells lie (the lateral direction of the drawing).

The current supply circuit 12 has the same configuration as that of the current supply circuit 11. The decoder 7 has the same configuration as that of the decoder 6. However, as described above, in one of the write lines 2 and 3, the write current may flow in only one direction. Thus, one of the current supply circuits 11 and 12 has only to have either a driver or a sinker.

A reading circuit is similar to that shown in FIG. 12. That is, the reading circuit shown in FIG. 12 is provided on the write line 2 or 3 connected to the memory cell 1.

Figure 14:
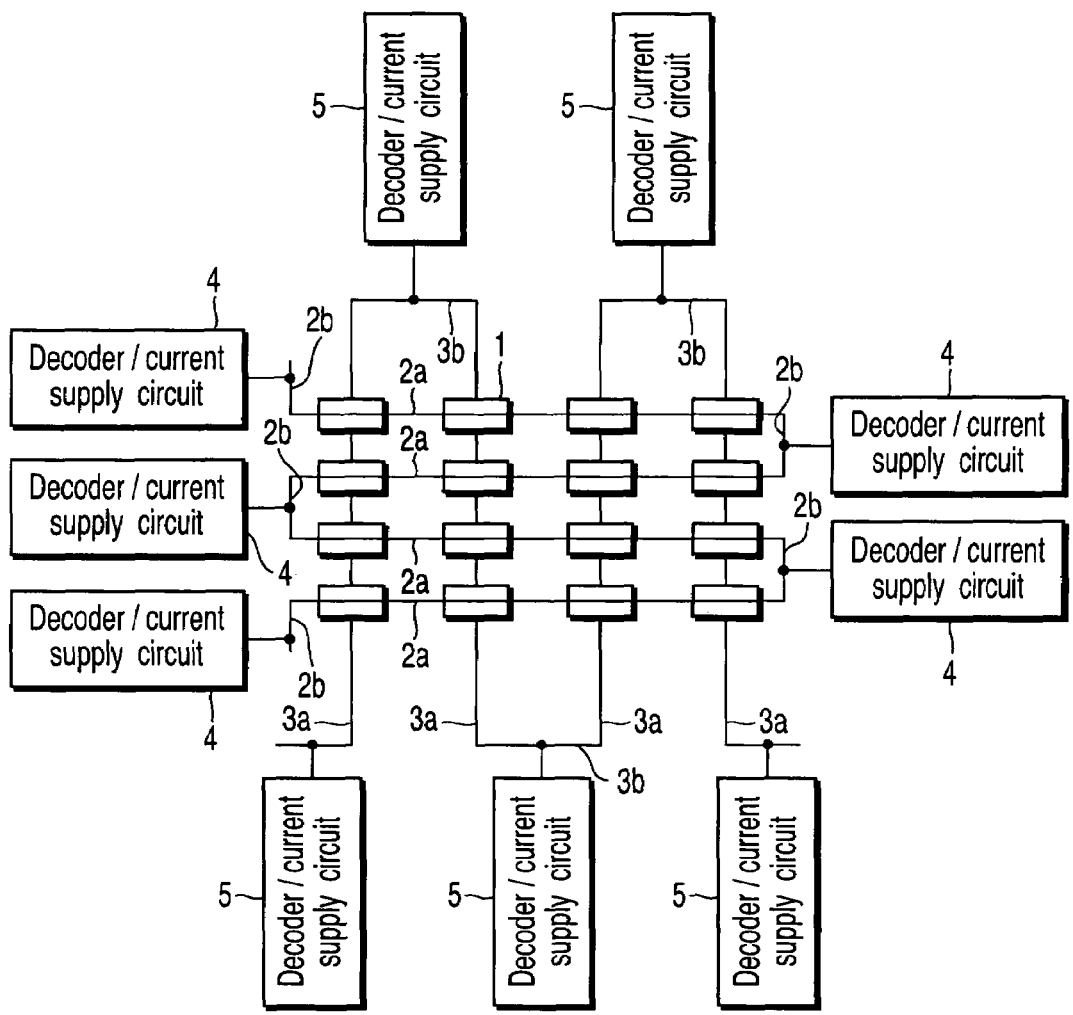
FIG. 14 is a plan view schematically showing a main part of a magnetic random access memory according to a variation of the third embodiment of the present invention.

In the example shown in FIG. 13, the current supply circuit is shared by some rows (columns), as in the case of the second embodiment. However, the present invention is not limited to this. As shown in FIG. 14, the current supply circuit/decoder 4 (5) may be provided for each row (column). Moreover, the configuration of the first embodiment may be applied only to either the rows or the columns.

With the magnetic random access memory according to the third embodiment, the write line 2 is implemented as a continuous shape passing some rows as in the case of the first embodiment. Furthermore, one decoder 6 is provided for every two rows as in the case of the second embodiment. Thus, the third embodiment produces the same effects as those of the first and second embodiments.

Moreover, in the third embodiment, the write line 3 is also implemented as a continuous shape passing the columns.

Further, one decoder 7 is provided for every two columns. Thus, the present embodiment produces the same effects as those of the second embodiment (first embodiment) in connection with the decoder 7 for the write line 3.

The continuous shape is applied to both the write line extending along the rows and the write line extending along the columns as described above. This results in a further reduction in the area of the magnetic random access memory compared to that achieved by applying the continuous shape to only one of the write lines.

Fourth Embodiment

According to the fourth embodiment, each memory cell array is provided with some write lines shaped as shown in the first embodiment to cover the entire memory cell array.

Figure 15:
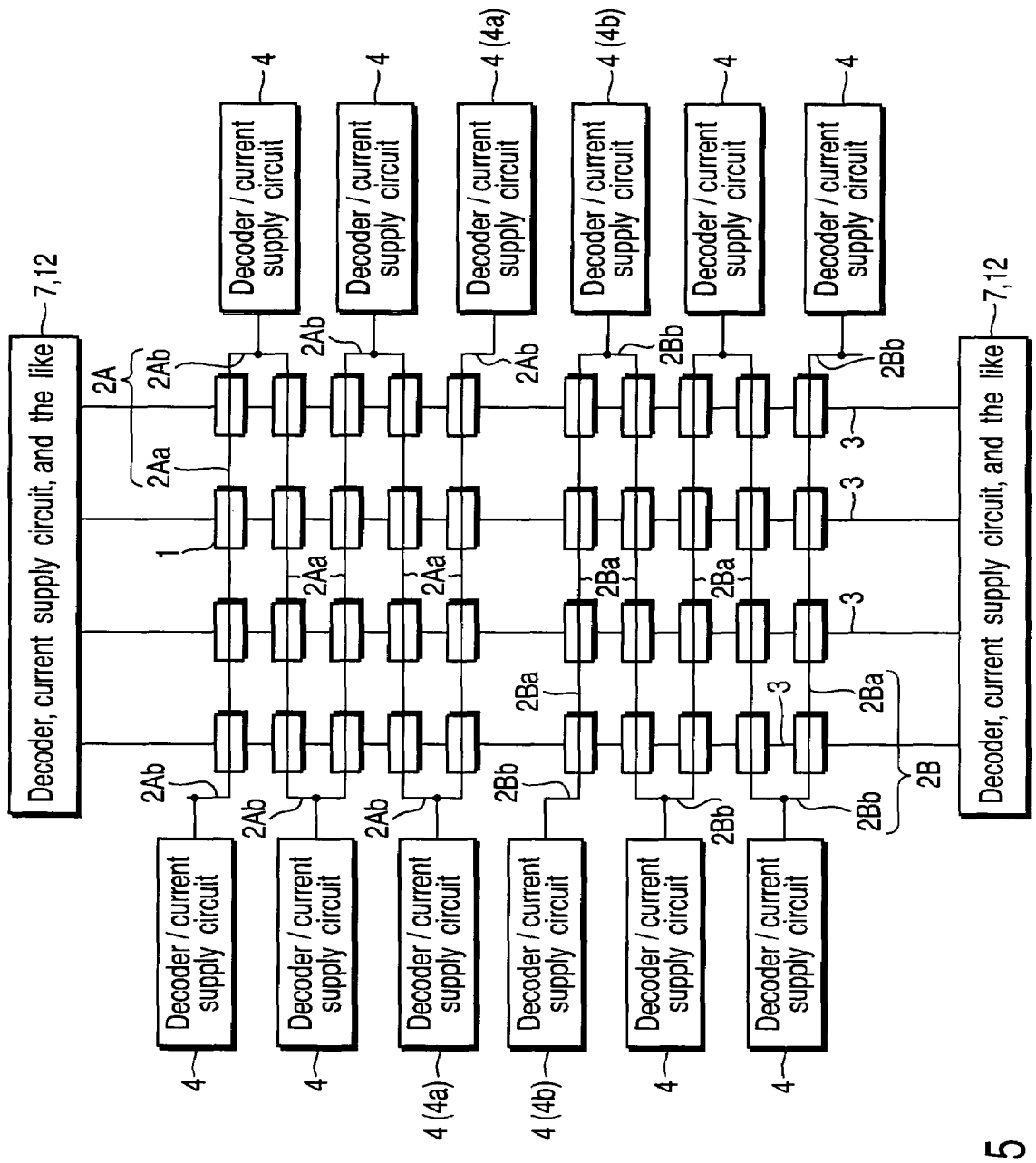
FIG. 15 is a plan view schematically showing a main part of a magnetic random access memory according to a fourth embodiment of the present invention.

FIG. 15 is a plan view schematically showing a main part of a magnetic random access memory according to a fourth embodiment of the present invention. As shown in FIG. 15, one memory cell array is provided with some write lines 2A and 2B (the figure illustrates two write lines) instead of one write line 2.

The write lines 2A and 2B are separated from each other. Further, the write lines 2A and 2B have the same configuration as that of the write line 2. That is, the write line 2A consists of extending portions 2Aa passing the rows, and connection portions 2Ab connecting two adjacent extending portions 2Aa at their ends. Similarly, the write line 2B consists of an extending portions 2Ba passing the rows, and a connection portions 2Bb connecting two adjacent extending portions 2Ba at their ends.

One decoder/current supply circuit 4 is provided for each of the connection portions 2Ab and 2Bb, as in the case of the first embodiment. As shown in FIG. 16, as in the case of the second embodiment, some extending portions 2Aa and 2Ba may share the current supply circuit 11 and the decoder 6 may control the select transistor TS, which is connected between the connection portions 2Ab and 2Bb and the current supply circuit 11.

As described in the second embodiment, either of the configurations described in the first and second embodiment is applicable to the decoder 7 for the write line 3 and the current supply circuit 12.

Moreover, as in the case of the third embodiment, the configuration of the write line 2 according to the present embodiment is applicable to the write line 3. This results in a further reduction in the area of the magnetic random access memory compared to that achieved by applying the configuration according to either the first or second embodiment only to the write line 2.

With the magnetic random access memory according to the fourth embodiment of the present invention, as in the case of the first embodiment, the write line 2 is implemented as a continuous shape passing the columns. Further, one decoder/current supply circuit 4 is provided for every two columns. Thus, the present embodiment produces the same effects as those of the first embodiment.

Further, according to the fourth embodiment, some continuous write lines 2A and 2B cover the memory cells 1. Hence, the write lines 2A and 2B are shorter than the single write line covering all the memory cells. This makes it possible to reduce the area disabled if, for example, a process error causes a short circuit between the write line 2 and another wire or the like. Further, the total number of elements connected to the write lines 2A and 2B decreases to reduce the parasitic capacity of the write lines 2A and 2B.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
  a plurality of memory cells which store information using an internal magnetization direction;
  a first write line including a first extending portion, a second extending portion and a first connection portion, the first extending portion extending along a first direction and having a first end and a second end, the second extending portion extending along the first direction and having a third end facing the first end and a fourth end facing the second end, the first connection portion connecting the first end and the third end;
  a second write line, the first write line and the second write line sandwiching one of the plurality of memory cells; and
  a plurality of first peripheral circuits connected to the first connection portion, the second end, and the fourth end.

2. The memory according to claim 1, wherein the second end and the fourth end are connected to one of the plurality of first peripheral circuits, and
  when a current flows through the first extending portion, one of the plurality of first peripheral circuits connected to the second end and the plurality of first peripheral circuits connected to the first connection portion are activated, and one of the plurality of first peripheral circuits connected to the fourth end is inactivated.

3. The memory according to claim 1, wherein the plurality of first peripheral circuits include:
  a current supply circuit including at least one of a current driver which supplies a current to at least one of the first extending portion and the second extending portion, and a current sinker which leads out a current from at least one of the first extending portion and the second extending portion; and a decoder which controls the current driver and the current sinker to set the current driver and the current sinker active or inactive.

4. The memory according to claim 1, further comprising:
  a first current supply circuit including at least one of a current driver which supplies a current to at least one of the first extending portion and the second extending portion, and a current sinker which leads out a current from at least one of the first extending portion and the second extending portion;
  a second current supply circuit including at least one of a current driver which supplies a current to at least one of the first extending portion and the second extending portion, and a current sinker which leads out a current from at least one of the first extending portion and the second extending portion;
  a first switch which selectively electrically connects the first current supply circuit and the second end;
  a second switch which selectively electrically connects the first current supply circuit and the fourth end; and
  a third switch which selectively electrically connects the second current supply circuit and the first connection portion,
  wherein the plurality of first peripheral circuits include a decoder which controls the first switch, the second switch, and the third switch.

5. The memory according to claim 1, wherein the second write line includes a third extending portion which extends along a second direction different from the first direction and which has a fifth end and a sixth end, a fourth extending portion which extends along the second direction and which has a seventh end facing the fifth end and an eighth end facing the sixth end, and a second connection portion connecting the fifth end and the seventh end; and the memory further comprises a plurality of second peripheral circuits connected to at least one of the sixth end and the eighth end and to the second connection portion to flow a current through the second write line.

6. The memory according to claim 1, wherein the first write line is electrically connected to one end of selected one of the plurality of memory cells, and during a read operation, the first write line is set a ground potential, and a potential is supplied to another end of the selected one of the plurality of memory cells so as to detect a change in a potential at said another end of the selected one of the plurality of memory cells or a change in current flowing through said another end.

7. The memory according to claim 1, wherein the second write line includes a third extending portion, a fourth extending portion and a second connection portion, the third extending portion extending along the first direction and having a fifth end and a sixth end, the fourth extending portion extending along the first direction and having a seventh end facing the fifth end and an eighth end facing the sixth end, the second connection portion connecting the fifth end and the seventh end, the second write line being electrically unconnected to the first write line.

8. A magnetic random access memory comprising:

a plurality of memory cells arranged in a matrix and storing information using an internal magnetization direction;

a first write line comprising a plurality of first extending portions passing rows of the matrix and a plurality of first connection portions, the plurality of first extending portions having a first end at a same side and having a second end at a same side, the first end of one of the first extending portions connected to an adjacent first end on one side by one of the plurality of first connection portions, and the second end of the one of the first extending portions connected to an adjacent second end on the other side by another one of the plurality of first connection portions;

a second write line, the first write line and the second write line sandwiching the plurality of memory cells; and a plurality of peripheral circuits each of which is provided for one of the plurality of first connection portions to flow a current through one of the plurality of first extending portions.

9. The memory according to claim 8, wherein when a current flows through selected one of the plurality of first extending portions, two of the plurality of peripheral circuits connected to the selected one of the plurality of first extending portions are activated and a plurality of peripheral circuits different from the two of the plurality of peripheral circuits are inactivated.

10. The memory according to claim 8, wherein the plurality of first peripheral circuits include:

a current supply circuit including at least one of a current driver which supplies a current to one of the plurality of first extending portions and a current sinker which leads out a current from one of the plurality of first extending portions; and a decoder which controls the current driver and the current sinker to set the current driver and the current sinker active or inoperative.

11. The memory according to claim 8, further comprising:

a first current supply circuit including at least one of a current driver which supplies a current to one of the plurality of first extending portions and a current sinker which leads out a current from one of the plurality of first extending portions;

a second current supply circuit including at least one of a current driver which supplies a current to one of the plurality of first extending portions and a current sinker which leads out a current from one of the plurality of first extending portions;

a plurality of first switches which selectively electrically connect the first current supply circuit to the plurality of first connection portions connected to the first end of the plurality of first extending portions; and a plurality of second switches which selectively electrically connect the second current supply circuit to the plurality of first connection portions connected to the second end of the plurality of first extending portions; and wherein the plurality of first peripheral circuits include a decoder which controls the plurality of first switches and the plurality of second switches.

12. The memory according to claim 8, wherein the second write line consists of a plurality of second extending portions passing columns of the matrix and a plurality of second connection portions, the plurality of second extending portions has a third end at a same side and has a fourth end at a same side, and the plurality of second connection portions connect the third end of first one of adjacent three of the plurality of second extending portions to the third end of second one of the adjacent three of the plurality of second extending portions and connecting the fourth end of the first one of the adjacent three of the plurality of second extending portions to the fourth end of third one of the adjacent three of the plurality of second extending portions.

13. The memory according to claim 8, wherein the first write line is electrically connected to one end of selected one of the plurality of memory cells, and during a read operation, the first write line is set a ground potential, and a potential is supplied to another end of the selected one of the plurality of memory cells so as to detect a change in a potential at said another end of the selected one of the plurality of memory cells or a change in current flowing through said another end.

14. The memory according to claim 8, wherein one or both of the first write line and the second write lines consist or consists of a plurality of parts separated from each other.

15. The memory according to claim 1, wherein the second write line extends along a second direction;

the first direction and the second direction define a first plane; and the first connection portion extends along the first plane.

16. The memory according to claim 15, wherein one of the plurality of memory cells comprises layers stacked along a third direction which is perpendicular to the first plane.

17. The memory according to claim 8, wherein the plurality of first extending portions extend along a first direction and the second direction extends along a first direction;

the second write line extends along a second direction;

the first direction and the second direction define a first plane; and the first connection portion extends along the first plane.

18. The memory according to claim 17, wherein one of the plurality of memory cells comprises layers stacked along a third direction which is perpendicular to the first plane.

* * * * *